Sept. 8, 1970 G. L. MANICKI 3,528,044

TOUCH CONTROLLED TV CHANNEL SELECTOR COMPRISING A PLURALITY OF BISTABLE SWITCHING CIRCUITS

Filed June 19, 1968 3 Sheets-Sheet 1

Inventor
Gert L. Manicki
By J. Patrick Cagney
Atty

R1, R11, R21 - 10K
R2, R12, R22 - 180 Ω
R3, R13, R23 - 47 K
R4, R14, R24 - 4.7K
R5, R15, R25 - 47 K
R6, R16, R26 - 4.7K
R7, R17, R27 - 10K
R8, R18, R28 - 100K
R9 - 330 Ω

Inventor
Gert L. Manicki
By
J. Patrick Cagney
Atty

Inventor
Gert L. Manicki
By J. Patrick Cagney Atty

United States Patent Office 3,528,044

Patented Sept. 8, 1970

3,528,044

TOUCH CONTROLLED TV CHANNEL SELECTOR COMPRISING A PLURALITY OF BISTABLE SWITCHING CIRCUITS

Gert L. Manicki, Port Credit, Ontario, Canada, assignor to Standard Kollsman Industries, Inc., Melrose Park, Ill.

Filed June 19, 1968, Ser. No. 738,350
Int. Cl. H03j *5/04;* H03h *5/12*
U.S. Cl. 334—15 6 Claims

ABSTRACT OF THE DISCLOSURE

Touch controlled voltage selectors are disclosed to electrically control frequency tuning of a solid state, voltage responsive type of VHF television tuner. The selectors have an output voltage bus that is selectively fed from a ganged chain of control stages (one for each channel) to apply various levels of tuning voltage to the tuner and a switching voltage bus that is connected to the control stages common to the high band of channels to provide switching current for band switching from the low band to the high band.

One of the selector embodiments has control stages comprised of bistable transistor multivibrator circuitry and the other has control stages comprised of bistable neon lamp circuitry. Each type of bistable circuit is gang-connected to its companion circuits to cause any selected circuit, when switching from its inactive to its active state, to simultaneously cause any other stage, if active, to switch from its active state to an inactive state.

BACKGROUND OF THE INVENTION

A typical solid state television tuner utilizing this technique of channel control is disclosed in Gossard et al. application Ser. No. 671,011, filed Sept. 27, 1967 and entitled Solid State Television Tuner. This tuner requires the application of voltages of various levels predetermined in accordance with the desired frequency or channel, and it requires the supply of current for band switching. The conventional approach for obtaining the desired voltages and currents would be the use of mechanical switches.

SUMMARY OF THE INVENTION

This invention relates to multi-channel wave receivers and more particularly is concerned with a voltage selector for electrically controlling frequency tuning of a voltage responsive type of multi-channel tuner such as is useful in conventional television receivers.

In accordance with this invention, a voltage selector has an output voltage bus individually coupled to a number of control stages that are successively gang-coupled to actuate individually for exclusively determining the output voltage level, with each control stage having sensing means responsive to individual actuation for activating such stage. The voltage selector is connected to a tuner having resonant circuit means that includes voltage-responsive variable reactance means operable in response to predetermined levels of applied voltage to tune the resonant circuit means individually to each of a number of predetermined channels.

In the case of a television tuner having a low frequency band of channels (channels 2 to 6) and a high frequency band of channels (channels 7 to 13), the resonant circuit means includes separately connectable frequency determining reactance means and voltage-dependent switching means for controlling the connection of such reactance means for selectively switching the resonant circuit means between the low and high frequency bands. In accordance with this invention, the selector has a switching voltage bus connected to determine the applied voltage at the voltage-dependent switching means, and means for connecting to the bus those control stages that correspond to one of the bands for switching the resonant circuit means to a frequency range corresponding to such band when any one of such control stages is activated.

The multi-stage voltage selector arrangements disclosed herein utilize touch sensitive elements that have no mechanical moving parts and mechanical switching of voltages and currents is eliminated so as to mate with solid state tuners which are also void of any moving parts. The multi-stage selectors may be of any desired capacity and in each case each control stage is of a bistabe type with all switching being done by D.C. Each stage, besides switching on a given voltage is also capable of providing current switching to enable the band switching function. Any one stage when initiated to its selecting state switches any other stage to the opposite state.

In one embodiment, the circuit for each stage consists of a transistor, bistable multivibrator which is switched between states at the initiation of a light dependent resistor (LDR). The light dependent resistors for the various control stages are mounted adjacent individual holes in an apertured control panel to permit fingertip masking of any hole to block ambient light from the corresponding LDR.

In another embodiment, the circuit for each stage utilizes a neon lamp system triggered by a voltage divider network in response to finger capacitance effects. The neon lamps for the various control stages are mounted in access holes in an apertured control panel to allow for finger touch initiation thereof.

Other features and advantages of the invention will be apparent from the following description and claims, and are illustrated in the accompanying drawings which show structure embodying preferred features of the present invention and the pirnciples thereof, and what is now considered to be the best mode in which to apply these principles.

BRIEF DESCRIPTION OF THE DRAWINGS

In the accompanying drawings forming a part of the specification, and in which like numerals are employed to designate like parts throughout the same.

DESCRIPTION OF THE PREFERRED EMBODIMENTS

Figure 1:
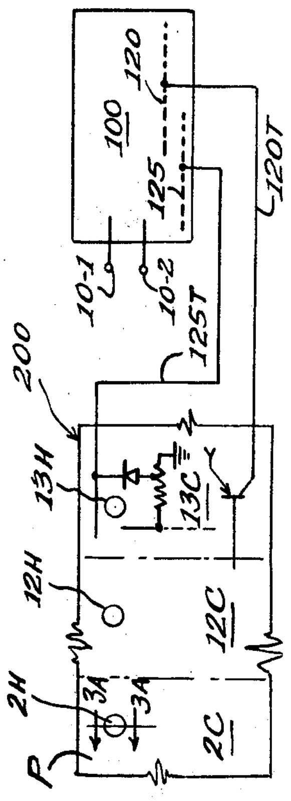
FIG. 1 is a block diagram representation of a television receiver arrangement incorporating a voltage responsive type of multi-channel tuner unit and a voltage selector unit that electrically actuates the tuner unit, with selected circuit elements being illustrated to show the interconnection of the units.

For purposes of illustrative disclosure, the invention is described in relation to a conventional television receiver. A VHF tuner 100 such as is disclosed in Gossard et al. application Ser. No. 671,011, filed Sept. 27, 1967, the disclosure of which, to the extent not inconsistent herewith, is specifically incorporated herein by this reference, is shown in FIG. 1 connected to a voltage selector 200 which supplies voltage over a tap line 125T of various levels that are predetermined in accordance with the desired frequency or channel and that provides a supply of current over a tap line 120T for band switching.

Figure 3:
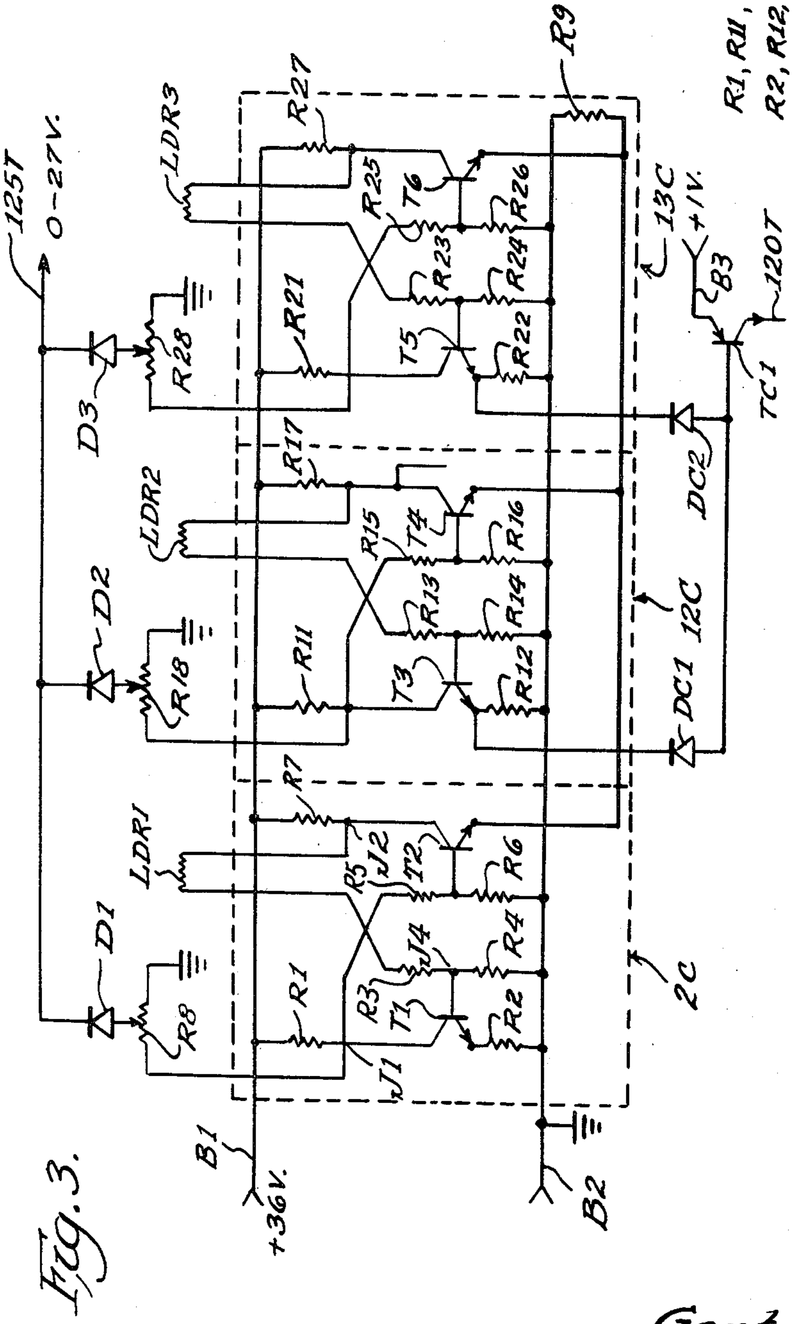
FIG. 3 is a schematic circuit diagram of one embodiment of a selector unit utilizing ganged control stages, each consisting of a transistor, bistable multivibrator including a light dependent resistor for switching control.
Figure 4:
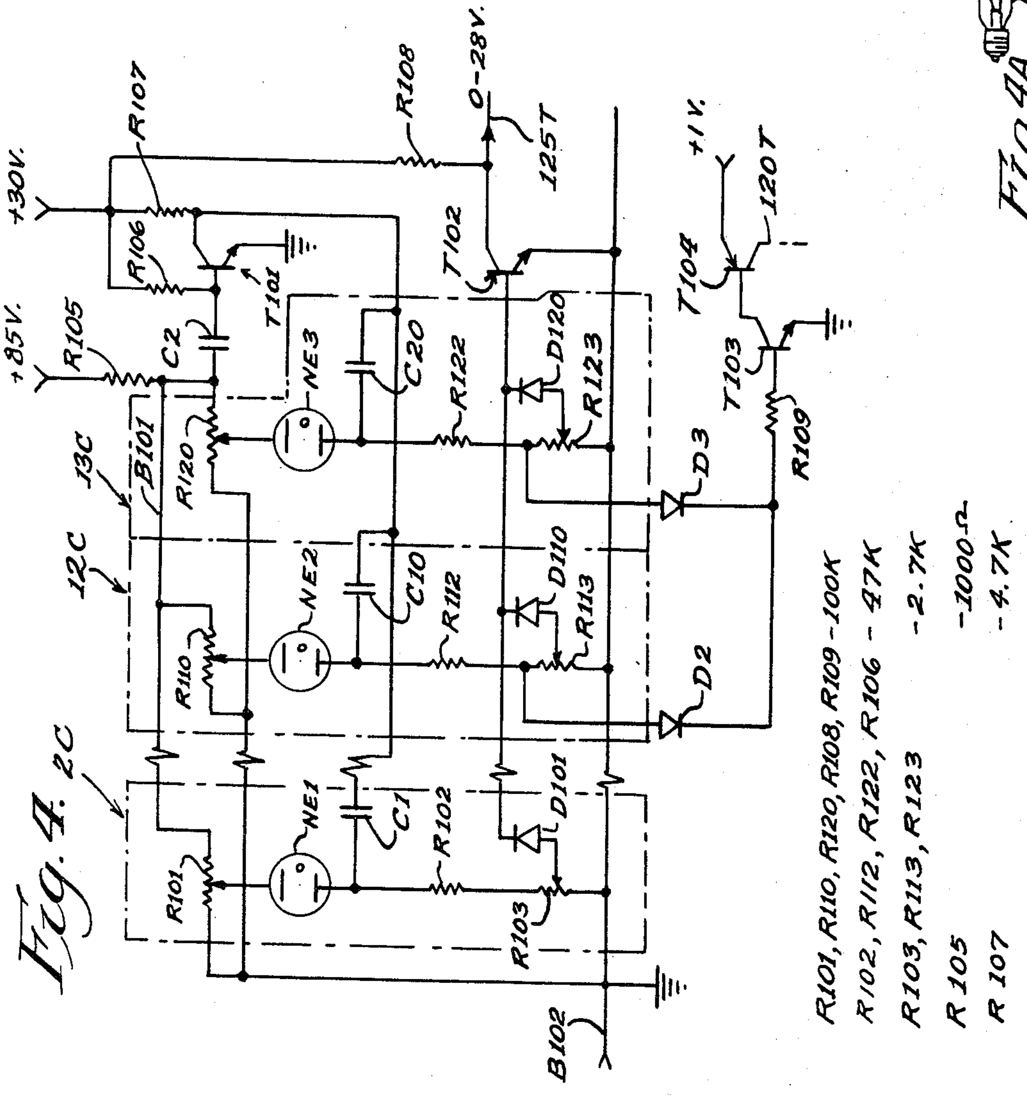
FIG. 4 is a schematic circuit diagram of another embodiment of a selector unit utilizing ganged control stages, each consisting of a neon lamp circuit triggered by a voltage divider network responsive to finger capacitance effects on the neon lamp.

Particular embodiments of selectors are shown in FIGS. 3 and 4 and in each case the selector circuit consists of ganged control stages, one for each channel to be tuned. Taking a VHF tuner, for simplicity of disclosure, which comprises 12 channels conventionally designated from 2 to 13, the selector 200 will have 12 control stages, one for each channel. In FIG. 1, the selector 200 is shown with only three control stages represented, these being represented as stages 2C, 12C and 13C corresponding to channels 2, 12 and 13 respectively.

In the conventional VHF tuner for television receivers, the channels are arranged in a low frequency band (channels 2–6) approximately spanning 57–88 megacycles and a high frequency band (channels 7–13) approximately spanning 177–213 megacycles. In the particular tuner 100 disclosed herein, the resonant circuit includes parallel inductances arranged so that a permanent inductance is operative to determine the low frequency band and a shunt high frequency inductance must be switched into operation to act in conjunction with the permanent inductance in determining the high frequency band. Thus, tuning in the low band is controlled solely by the applied voltage on line 125T but tuning in the high band is controlled both by the applied voltage on line 125T and the supply of switching current on line 120T. As will become apparent herein, stage 2C is not connected to line 120T as no band switching is required within the low band, whereas stages 12C and 13C are connected to provide switching of the shunt inductance for high band operation.

A selector face panel P such as is normally located at the front of a TV receiver cabinet is shown associated with the selector 200, the panel having a finger hole 2H, 12H and 13H for each control stage of the selector. Thus, in the disclosed embodiments, a simple touch control of channel tuning is provided. To tune to any particular channel, the viewer need only position a finger tip on the corresponding finger hole. For example, to tune to channel 12, a finger tip is positioned on hole 12H in the face panel and the corresponding control stage 12H is initiated to cause the proper level voltage to be applied over line 125T and to provide a switching current signal over line 120T.

Figure 3A:
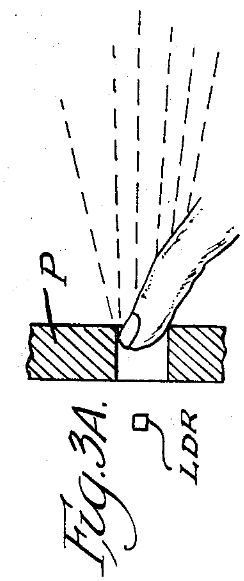
FIG. 3A is an enlarged fragmentary sectional view showing touch control of the light dependent resistor.

In the selector embodiment of FIG. 3, each control stage includes a light dependent resistor LDR which is positioned behind and in registry with a corresponding finger hole in the control panel P so that ambient light normally impinges thereon so that its resistance is a minimum to hold each control stage at its inactive state. As shown in FIG. 3A, a finger tip blocks the path of light to the LDR and its resistance will increase to cause its control stage to switch to its active state. Switching of any ganged control stage to active state switches any other stage, if "on," to an inactive state, with the newly actuated stage remaining active until another stage is actuated.

Figure 4A:
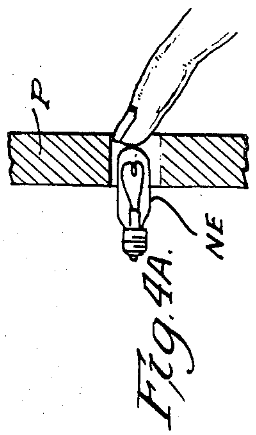
FIG. 4A is an enlarged fragmentary sectional view showing touch control of the neon lamp.

In the selector embodiment of FIG. 4, each control stage includes a neon lamp NE which is positioned within a corresponding finger hole in the control panel P, as shown in FIG. 4A. A finger tip touch of the neon lamp NE produces a change in the capacitance effect in the lamp circuit to actuate the circuit to an active state which is indicated by lighting of the lamp. Switching of any ganged control stage to active state, switches any other stage, if on, to an inactive state.

SOLID STATE TUNER

Figure 2:
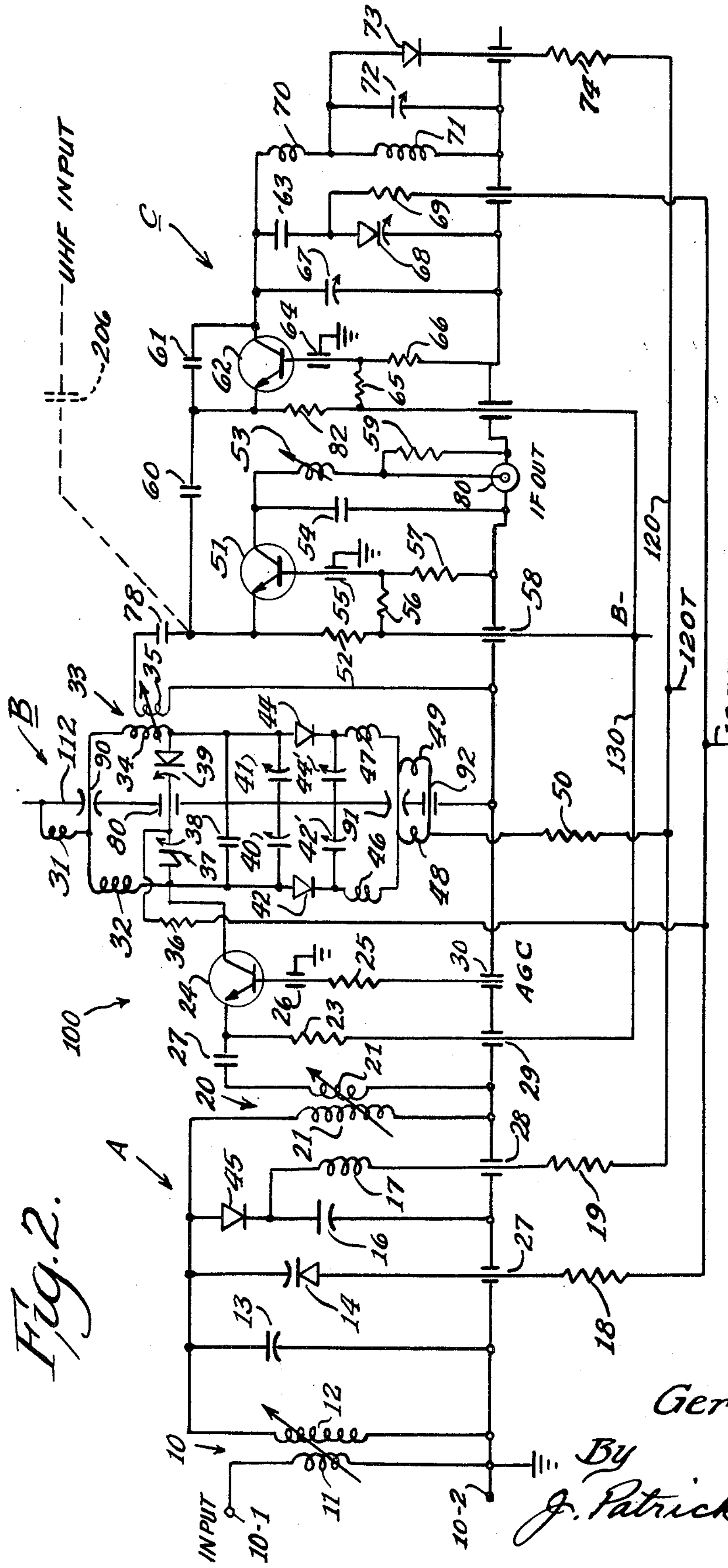
FIG. 2 is a schematic circuit diagram of a solid state voltage responsive type of tuner represented in FIG. 1.

Referring specifically to FIG. 2, the input to the tuner is presented to antenna terminals 10–1, 10–2, of matching step-up transformer 10. The step-up transformer includes an input coil 11, and an output coil 12. Step-up transformer 10 as well as the other inter-stage transformers of the tuner, are slugtuned to provide a proper tracking adjustment of the successive stages.

The antenna signal is then presented to the tunable preselector input circuit A for RF amplifier 24. Tunable preselector stage A includes an inductance means comprising the parallel disposition of secondary transformer coil 12 of the input step-up transformer 10, primary coil 21 of inter-stage coupling transformer 20, shunted by selectively added inductor 17. That is, inductors 12 and 21 are always in the circuit and inductor 17 is added to the tunable arrangement of tank circuit A when its parallel branch circuit is completed by the forward biasing of switching diode 45.

Switching diode 45 is connected to the high-low switching bus 120 via inductor 17, feed-through capacitor 28, and isolation resistor 19. The high-low switching bus 120 is controlled over line 120T from the selector 200 (see FIG. 1) to serve as a band switch voltage source means, for either forward biasing switching diode 45 to its appreciable conducting state (in the high band of operation), or reverse biasing switching diode 45 to its appreciable blocking state (in the low band of operation).

The selection of the desired channel, or frequency region, is achieved by voltage variable diode capacitor 14, which is in shunt across the inductance elements 12, 17, 21. Voltage variable diode capacitor 14 is connected to the variable voltage source bus 125, via feed-through capacitor 27 and isolation resistor 18. The variable voltage tuning source 125 typically includes a supply line 125T leading from the selector 200. As the negative voltage applied on line 125T is selected at various levels, the capacitance of diode element 14 is correspondingly adjusted to vary the resonant frequency of the tank circuit A. Trimmer capacitors 13 and 16 are included to permit a precise tracking adjustment of the operating frequency.

With diode switch 45 reverse biased (corresponding to the selection of the low band of operation), it will serve as an open circuit to effectively remove inductor 17 and trimmer capacitor 16 from the circuit. Hence, the resonant frequency will be principally established by inductors 12 and 21 in conjunction with the capacitance provided by voltage-variable diode capacitor 14. With switch diode 45 forward biased, its branch circuit will be completed, thereby adding the inductor 17 as an additional shunt inductance element, and raising the resonant frequency of that stage. The inductance of element 17 is selected in conjunction with the other inductances, and the capacitance range of diode 14 such that with inductance element 17 out of the circuit, the voltage-variable diode capacitor will tune that stage between the lower VHF band of approximately 57–88 megacycles. The addition of inductor 17 increases the resonant frequency of the stage such that the comparable range of capacitance adjustment provided by element 14 will now tune the stage between the higher VHF band in the order of 177–213 megacycles.

It should be recognized that by virtue of the above-discussed parallel inductance switching arrangement, the output signal of the preselector stage will be across primary inductance coil 21, corresponding to either the low or high bands of frequency operation. Thus, the single coupling transformer 20 including primary coil 21 and secondary coil 22 serves as the sole inductive coupling means between the input preselector and RF stages. The use of such inductive coupling advantageously permits a circuit design maintaining the highest Q on both the high and low frequency bands, and serves to achieve substantially constant band width over the entire VHF operating range.

The RF amplifier section includes transistor 24, in the grounded base configuration. The input signals from the preselector is presented to the emitter terminal thereof. The transistor is biased from source 130, via resistor 23. The bias voltage is blocked from ground by means of blocking capacitor 27. AGC is conventionally obtained from a successive stage of the television receiver (not shown) and appropriately applied to the base of transistor 24 via base resistor 25. The collector terminal of transistor 24 is connected to tuned stage B which advantageously combines the operation of the RF output tuning and mixer input tuning.

Considering first the RF output tuning arrangement, there is provided a low frequency coil 32, which will always be in the circuit; coil 32 is shunted by the voltage variable diode capacitor 37 and trimmer capacitor 40. The control voltage from common tuning bus 125 is connected to diode capacitor 37 via isolation resistor 36. The additional inductance element 46 for the high band of operation is inserted into the circuit by virtue of switching diode 42, with the switching signal input from band switch voltage bus 120 being presented thereto via resistor 50. Trimmer capacitor 42′ is also added.

The coupling between the tuned RF output and mixer stages is provided by common inductor 31, in conjunction with capacitor 38 and high band common inductor 48, 49, which are provided to insure a more constant bandwidth of operation over the entire VHF frequency band. The circuitry of the mixer input is substantially analogous to the RF output circuit, and includes low frequency coil 34, voltage variable diode capacitor 39, and trimmer capacitor 41. The selective control signal to voltage variable diode capacitor 39 is provided by a common circuit connection to the control signal of diode capacitor 37, via feed-through capacitor 80 located in partition wall 112. The parallel connectible high frequency inductance element 47 is circuit connectible via switchable diode 44, which receives its band-switch signal from switching bus 120 in common with diode 42, via isolation resistor 50, and also adds trimmer capacitor 44′ to the circuit.

The output signal of the intermediate, inductively-coupled tunable circuit arrangement B is present across the low frequency inductance element 34. This inductance element is the primary of coupling transformer 33. Hence, the output signal is coupled to secondary 35, thereof, and presented to the emitter terminal of mixer transistor 51, via blocking capacitor 78. Mixer 51 is in grounded base configuration, with the oscillator signal from the stage, generally indicated as C, also being presented to the emitter terminal via signal injection capacitor 60. The collector is appropriately biased by collector bias resistor 59. Capacitor 54 and adjustable inductor 53 are provided for appropriately tuning the output of mixer stage 51 to the receiver IF frequency. This IF frequency output is then presented at output connector 80 for circuit connection to the television receiver IF strip (not shown).

The oscillator circuit is shown including transistor 62 in the grounded base configuration. Resistor 82 serves as the emitter resistor, and resistors 65, 66 are base biasing voltage dividers. The variably tuned collector circuit of the oscillator includes inductor 70, which will always be in the circuit, with series inductor 71 being added to the circuit to provide additional inductance at the low frequency band. It will be noted that wherein the voltage controllable tuned stages A and B include the switching inductance in parallel with the permanent inductance, the oscillator circuit may include the series arrangement of inductances 70 and 71. This results from the fact that wherein the preselector, RF and mixer stages must be designed to maintain a constant bandwidth of operation, the design of the oscillator is principally concerned with maintaining a constant amplitude of oscillator signal which is then injected into the mixer. Thus, the oscillator circuit will be designed to achieve this in the most advantageous manner. It has been found that the particular oscillator circuit illustrated satisfies these requirements and provides an especially advantageous arrangement of achieving AFC control of the oscillator magnitude. It should, however, be understood that the selection of this circuit is for illustrative purposes only and tuners constructed in accordance with our invention may, where desirable, include a parallel disposition of inductance elements within the oscillator.

The band switching is provided by voltage controllable diode element 73, which is connected to the band switch voltage source 120 via resistor 74. The tuning of this stage is obtained by voltage variable capacitor diode 68 across the series arrangement of inductors 70, 71. The variable tuning input to diode 68 is provided from bus 125 via isolation resistor 69. Capacitor 63, in series with voltage variable diode capacitor 68, serves the conventional padding function for improved oscillator tracking.

It is therefore seen that the switching of the tuner 100 between the high and low frequency bands of operation is provided by the simultaneous application of the desired switching signal to diodes 45, 42, 44 and 73. The selection of the desired channel, or frequency portion, within the selected band is then obtained by the application of the appropriate negative potential to variable voltage diode capacitors 14, 37, 39 and 68. Advantageously, all the switching diodes are of the same type, such as the commercially available Siemens BA136 diode. Similarly, all the voltage variable diode capacitors should advantageously be of the same type, such as the commercially available ITT BA 141 varactor diode. Utilizing such commercially available tuning elements, the switching signals for reverse biasing and forward biasing the diode switches are respectively +2 to 4 volts and +40 milliamperes, and the tuning input to the voltage variable diode capacitors is continuously adjustable between −3 and −30 volts.

SELECTOR EMBODIMENT OF FIG. 3

In the selector circuit shown in FIG. 3, each control stage is essentially identical. Stage 2C is described as typical and consists of a bistable, transistor multivibrator which is switched from one state to another by a light dependent resistor LDR1.

The multivibrator circuit includes a conventional array of transistors T1, T2. A resistor R1 is connected from a 36 v. supply bus B1 to the collector of T1, through a junction J1 and resistor R2 is connected from a grounded bus B2 to the emitter of T1. A resistor R7 is connected from the supply bus B1 to the collector of T2 through a junction J2 and the emitter of T2 is connected through a voltage dropping resistor R9 to the grounded bus B2.

A voltage divider circuit comprising resistors R5, R6 and a junction J3 connected to the base of transistor T2 and a voltage divider network comprising light dependent resistor LDR1 and resistors R3, R4 has a junction J4 connected to the base of transistor T1. A potentiometer R8 is connected between ground and junction J1 and has its adjustable tap arm connected through a diode rectifier D1 to supply a predetermined level of voltage to the tuning voltage line 125T that controls the channel tuning function of the resonant circuits in the tuner.

All of the remaining stages employ similar bistable multivibrators, for example; stage 12C has transistors T3, T4, resistors R11 to R17, light dependent resistor LDR2 and an output potentiometer R18 connected through a diode rectifier D2 and stage 13C has transistors T5, T6, resistors R21 to R27, light dependent resistor LDR3 and an output potentiometer R28 connected through a diode rectifier D3.

Since stages 12C and 13C correspond to high frequency band channels 12 and 13, respectively, they are connected to initiate a power transistor TC1 which has its emitter connected to supply switching current over line 120T for effecting switching to high band operation. For this purpose the emitter terminal of transistor T3 is connected through a diode rectifier DC1 to a base supply voltage bus B3 for powder transistor TC1. The emitter terminal of transistor T5 is similarly connected through a diode rectifier DC2.

With reference to stage 2C, it is assumed that T1 is conducting, or is "on." The collector voltage will be near 0. Consequently the bias on the base of T2 will be 0 volt. As a result T2 is not conducting or is "off." The collector voltage is close to the supply potential. Through LDR1 and R3 a positive voltage appears across R4 and holds T1 in the "on" condition providing that LDR1 is exposed to light so that its resistance is at minimum.

When the path of light to LDR1 is interrupted (placing a finger over the aperture) the internal resistance of LDR1 rises to a very high value. Because of the relatively low resistance of R4, the voltage at the base of T1 drops to near 0 and T1 changes to the "off" condition, which in turn switches T2 to the "on" condition. Because T2 is conducting, the voltage on its collector is near 0 and therefore, even if LDR1 is exposed to light again (removing the finger) no current flows through LDR1, R3 and R4. T1 remains in the "off" condition and its collector voltage is at maximum. This voltage appears across R8, a potentiometer which can be pre-set for a required voltage. Thus, potentiometer R8 can be set to any given channel, but in this instance is set to supply a voltage over line 125T to tune the resonant circuits in the tuner 100 to the appropriate frequency for channel 2.

Stage 12C, or for that matter any successive stage, is identical to stage 2C, and explanation of switching function between stage 2C and stage 12C will suffice, and will apply to any number of stages. The main consideration is that only one stage must produce a voltage across its own potentiometer R8, R18, R28, at any one time and must therefore switch any other stage to an inactive state.

Stage switching is accomplished by resistor R9 which is a common emitter resistor for all even numbered transistors, T2, T6, T4. When stage 2C was actuated to an active state, that is, to a condition where T1 is "off" and T2 is "on" and emitter current of T2 is flowing through R9, it was assumed that T4 was "off." (Also T6, T8 and so on.) In the illustrated circuit, R9 is 330 ohms and the emitter current is 3 ma. for any "on" transistor. Since only T2 is "on" 1 volt will develop across R9.

When T4 is switched on by the absence of light on LDR2 with T3 going to "off," the combined emitter currents of both T2 and T4 flow through R9 causing a reverse bias condition for both T2 and T4. The collector currents are reduced and because the feed-back circuit of stage 2C is intact (LDR1 exposed to light and conducting), stage 2C will flip over and T2 will go to "off" and remain so. Stage 12C was unable to flip because its feed-back path was interrupted, LDR2 was high in resistance value while its aperture was closed. Now T3 is "off" and a voltage appears over R18. Any two of an indefinite number of stages will interact in the identical fashion, no matter where their individual location may be in the ganged chain of control stages.

Diodes D1, D2, D3 are provided for isolation of potentiometers R8, R18, R28. Since only one of the potentiometers at a time will have a positive voltage appearing at the center tap, only the diode associated therewith will conduct and provide a voltage to the frequency tuning line 125T. This determines the tuning voltage for the variable capacitance diodes in the tuner. Any desired voltage control stage, or a number of them, will be required to also select, independent of the required tuning voltage, either the low VHF band, channels 2 through 6, or the high VHF band, channels 7 through 13, or the UHF band, channels 14 through 83, though no specific disclosure of the latter is given herein. Two sets of switching diodes in the integrated tuner 100 require switching currents of up to 50 ma. per set.

Transistor TC1 is a current switch. When a given stage is selected to produce a tuning voltage the odd numbered transistor of this stage is "off." The potential over its emitter resistor R2, R12, R22, is 0. The base of TC1 is connected to this point and TC1 forward biased. This provides the current for the band switching diodes in the tuner. When TC1 is to be controlled from more than one stage, diodes DC1, DC2 are required for isolation. There is complete freedom of choice as to which voltage stage, or any number of them together, the current switch is connected to. Two current switching transistors are required for a fully integrated tuner, that is for a tuner that includes the UHF channels. If the described voltage and current switching circuit is produced in form of an integrated circuit of any type, it is desirable to include the light dependent resistors (or they might be light sensitive diodes) as part of the integrated circuit. With the use of fibre optics the light dependent devices can be controlled remotely. This gives complete freedom of exterior styling without affecting the standard switching unit.

SELECTOR EMBODIMENT OF FIG. 4

In the selector circuit shown in FIG. 4, each control stage is essentially identical to all others and the stages 2C, 12C and 13C, which are illustrated are gang-coupled and are connected to common buses which allow for use of any number of stages as required.

A source of lamp voltage is shown connected through resistor R105 to a supply bus B101 that feeds potentiometers R101, R110 and R120 which connect to a ground bus B102. The neon lamps NE1, NE2 and NE3 are connected between the ground bus B102 and each corresponding potentiometer through a corresponding series connected resistor R102, R112 and R122, and a corresponding series connected potentiometer R103, R113 and R123.

A separate source of voltage is also connected to feed transistors T101 and T102 through collector resistors R107 and R108, respectively. The tuning voltage line 125T for controlling frequency tuning of the tuner 100 is shown leading from the junction of the collector of transistor T102 with resistor R108, the voltage level being determined by the particular settings for each of the potentiometers R103, R113 and R123 which are connected to the base of transistor T102 through diode rectifiers D101, D110 and D120, respectively.

Capacitors C1, C10 and C20 are connected to the neon lamps NE1, NE2 and NE3 and are normally charged to a predetermined value through collector resistor R107. Transistor T101 has a capacitor C2 coupled from the main bus B101 to its base and a base bias resistor R106 bridged between the transistor voltage supply and the base of transistor T101 so that transistor T101 is normally conducting.

Potentiometers R101, R110 and R120 are adjusted so that the voltage on each center arm to the neon lamp is 3 volts lower than the self-firing voltage of each respective neon lamp. When one of the neon lamps is ignited by finger capacitance, for instance NE1, a small positive potential will appear at the center arm of potentiometer R103. This will permit base current of transistor T102 to flow through diode D101 and depending on the setting of the center arm of potentiometer R103 the base bias of T102 can be selected. The resulting change in collector current of T102 will determine the voltage drop over R108. This is the tuning voltage, which is adjustable by pre-setting of R3, to any value between 0 and close to 30 volts, depending on the requirements of the tuner circuits. When another neon lamp is fired by finger touch the additional current will cause a small voltage change over R105 to produce a voltage drop. Capacitor C2 discharges this voltage drop or pulse through R106, the base bias resistor of T101.

T101 is normally "on," but during the duration of the pulse on its base, it is switched "off" thus producing a positive pulse that is transmitted through capacitors C1, C10, C20 and resistors R102, R112 and R122. The rise in voltage extinguishes any neon lamp which is on, except the one which was just ignited. Its capacitor was charged up with the same potential when a positive voltage appeared over the associated resistor.

Transistors T103 and T104 make up the current or band switching stage. Because the base current of T104 is relatively large in comparison with the neon lamp current, and would upset the voltage at the junctions R112 and R113, or any equivalent point in any other stage, T104 is connected in a collector follower arrangement with T103. In conjunction with R109, the impedance of the current switching stage is raised sufficiently to avoid overload of the voltage circuit.

I claim:

1. In a multi-channel wave receiver; the combination comprising a tuner having resonant circuit means that includes voltage-responsive variable reactance means operable in response to predetermined levels of applied voltage to tune said resonant circuit means individually to each of a number of frequency channels, and selector means for selecting and applying said levels of applied voltage, said selector means including an output voltage bus connected in voltage determining relation to said reactance means, a plurality of bi-stable switching circuits, a separate one of said switching circuits for each of said frequency channels, each switching circuit having sensing means responsive to individual momentary actuation for activating such switching circuit from an inactive state to an active state, and circuit means coupling said switching circuits individually to said bus and in successively electrically gang-coupled relation to each other to enable any switching circuit to activate individually and exclusively determine the voltage level at said bus, each of said switching circuits being a transistor bi-stable multi-vibrator.

2. In a multi-channel wave receiver in accordance with claim 1 and wherein each of said sensing elements is of variable impedance characteristics.

3. In a multi-channel wave receiver in accordance with claim 1 and wherein said resonant circuit means of said tuner includes separately connectable frequency determining reactance means and voltage-dependent means for controlling the connection of the last-named reactance means for selectively switching the resonant circuit means between a low frequency band of channels and a high frequency band of channels, said switching circuits including a separate switching circuit for each channel of said low band and a separate switching circuit for each channel in said high band, said selector means having a switching voltage bus connected to determine the applied voltage at such voltage-dependent means and means coupling those switching circuits that correspond to one of said bands to said switching voltage bus to activate said switching bus when any one of the last-named switching circuits is activated by its sensing means.

4. In a multi-channel wave receiver, the combination comprising a tuner having resonant circuit means that includes voltage-responsive variable reactance means operable in response to a control voltage to tune said resonant circuit means to a frequency value determined by the voltage level of said control voltage and selector means for selecting and applying a control voltage to said variable reactance means, said selector means including an output voltage bus connected in voltage determining relation to said variable reactance means, a number of bi-stable switching circuits, each switching circuit having individual sensing means responsive to momentary actuation for triggering such switching circuit from an inactive state to an active state, each switching circuit having a voltage determining element that establishes a predetermined voltage level when such switching circuit is in an active state, means electrically interconnecting said bi-stable switching circuits in a gang-coupled interlocked relation wherein any switching circuit when switched from an inactive state to an active state causes any other switching circuit in an active state to return to an inactive state, and means connecting the voltage determining elements of said switching circuits to said bus to enable only the voltage determining element of the active switching circuit to determine the voltage level of said bus, each of said switching circuits being a transistor bistable multi-vibrator.

5. In a multi-channel wave receiver in accordance with claim 4, wherein each voltage determining element is a preset potentiometer and wherein a diode is connected between each preset potentiometer and said output voltage bus.

6. In a multi-channel wave receiver in accordance with claim 4 and wherein said tuner includes an additional frequency determining reactance means connectable to said resonant circuit means for switching the resonant frequency value between a first frequency band of channels and a second frequency band of channels, and voltage responsive means for controlling connection of said additional reactance means to said resonant circuit means, said selector means including a switching voltage bus connected in voltage determining relation to said voltage responsive means, said switching circuits being comprised of a first group comprised of a separate switching circuit corresponding to each channel of said first band and a second group comprised of a separate switching corresponding to each channel of said second band, means responsive when any switching circuit of said second group is switched to an active state for applying a predetermined switching voltage to said switching bus.

References Cited

UNITED STATES PATENTS 3,264,566 8/1966 Kaufman et al ---- 325—462 X
3,354,397 11/1967 Wittig ------------ 334—15 X HERMAN KARL SAALBACH, Primary Examiner P. L. GENSLER, Assistant Examiner U.S. Cl. X.R.

307—320; 325—459, 465; 334—78; 340—258